United States Patent

Salcedo

[11] Patent Number: 5,587,684
[45] Date of Patent: Dec. 24, 1996

[54] POWER DOWN CIRCUIT FOR USE IN INTERGRATED CIRCUITS

[75] Inventor: Jose A. Salcedo, Livermore, Calif.

[73] Assignee: Exar Corporation, San Jose, Calif.

[21] Appl. No.: 440,272

[22] Filed: May 12, 1995

[51] Int. Cl.$^6$ .............................. G05F 1/10; H03K 17/22
[52] U.S. Cl. ........................ 327/538; 327/545; 327/143; 327/198
[58] Field of Search ................ 327/60, 143, 544, 327/77, 530, 538, 539, 540, 541, 543, 545, 546, 198, 78

[56] References Cited

U.S. PATENT DOCUMENTS

| | | | |
|---|---|---|---|
| 4,428,020 | 1/1984 | Blanchard, Jr. | 327/545 |
| 4,473,762 | 9/1984 | Iwahashi et al. | 327/538 |
| 4,599,672 | 7/1986 | Planer et al. | 327/545 |
| 4,774,497 | 9/1988 | Taylor | 330/279 |
| 5,130,580 | 7/1992 | Min et al. | 327/53 |
| 5,373,227 | 12/1994 | Keeth | 327/541 |
| 5,394,104 | 2/1995 | Lee | 327/78 |
| 5,420,539 | 5/1995 | Fensch | 330/253 |
| 5,434,533 | 7/1995 | Furutani | 327/538 |

FOREIGN PATENT DOCUMENTS

| 1126032 | 5/1989 | Japan | 327/362 |
|---|---|---|---|
| 6232715 | 8/1994 | Japan | 327/143 |

*Primary Examiner*—Timothy P. Callahan
*Assistant Examiner*—Terry L. Englund
*Attorney, Agent, or Firm*—Townsend and Townsend and Crew LLp

[57] ABSTRACT

A method of including power control features to analog integrated circuits does not require the addition of separate power control input signal pin(s). One or more existing externally applied reference signals are sensed to determine if the signals are within specified operational limits. When the reference signals are outside of the operational limits the internal circuit blocks are switched off to their non-power dissipating state. When the reference signals are within the operational limits the internal circuit blocks are switched on to their normal operating state. This switching can be accomplished in various ways, including but not limited to a single switch in a series with the power supply or many distributed switches in each circuit block or stage.

8 Claims, 2 Drawing Sheets

POWER DOWN CIRCUIT FOR USE IN INTERGRATED CIRCUITS

BACKGROUND OF THE INVENTION

This invention relates to power down circuitry for use in battery operated electronic devices, and more particularly the invention relates to power down circuitry in such devices which can be distributed to and incorporated in integrated circuits of the devices.

Power consumption and the conservation of energy is a particular concern in battery operated devices such as portable lap top computers, portable phones, battery powered field test equipment, and the like. Traditional power conservation relies on switching power on and off to major subassemblies, or to sections of electrical circuitry on a printed circuit board. This can require bulky, high current switching devices and introduce unwanted design constraints.

Integrated circuit technology advances have resulted in a dramatic increase in analog integrated circuit density. Early analog circuits included many discrete components that were encapsulated into a module. However, the discrete components, such as an operational amplifier, can now be formed as an integral part of an integrated circuit. Heretofore, some integrated circuits such as random access memories (RAMs) have been provided with chip enable pins through which a chip select signal could be applied in controlling power to the chip. However, in many existing analog integrated circuits no provision has been made for select pins in receiving power control signals. Power control in such circuits through use of external power switches, multiplexing digital outputs in ADC circuits, altering the analog output, or stopping a clock in one state have been considered but are not feasible design alternatives.

The present invention is directed to providing analog integrated circuits, such as ADC and DAC circuits which require external reference voltages, with internal circuitry for power control based on the presence or absence of the reference voltage.

SUMMARY OF THE INVENTION

In accordance with the invention, an integrated analog circuit utilizes an externally applied reference voltage for controlling power components of the analog circuit. In an ADC circuit, for example, a reference voltage (e.g., +5 volts) is applied to the reference input pin of the integrated circuit. The presence or absence of a valid reference signal is sensed and used to control the application of power (e.g., VDD) to the various stages of the ADC circuit. A separate power control pin is not required, and the invention can be incorporated in second source chips as replacements for older circuit designs not having a power control pin.

In a preferred embodiment, the applied reference voltage is Compared with an internal threshold voltage in an internal comparator, and the comparator then drives logic circuitry which controls power switch means for controlling power to various stages of the integrated circuit. If a separate power control input pin is provided to the chip, the logic circuitry can include a gate which receives the comparator output and the power control input whereby either signal will control the power switch means.

The invention and objects and features thereof will be more readily apparent from the following detailed description and appended claims when taken with the drawing.

DETAILED DESCRIPTION OF ILLUSTRATIVE EMBODIMENTS

Figure 1:
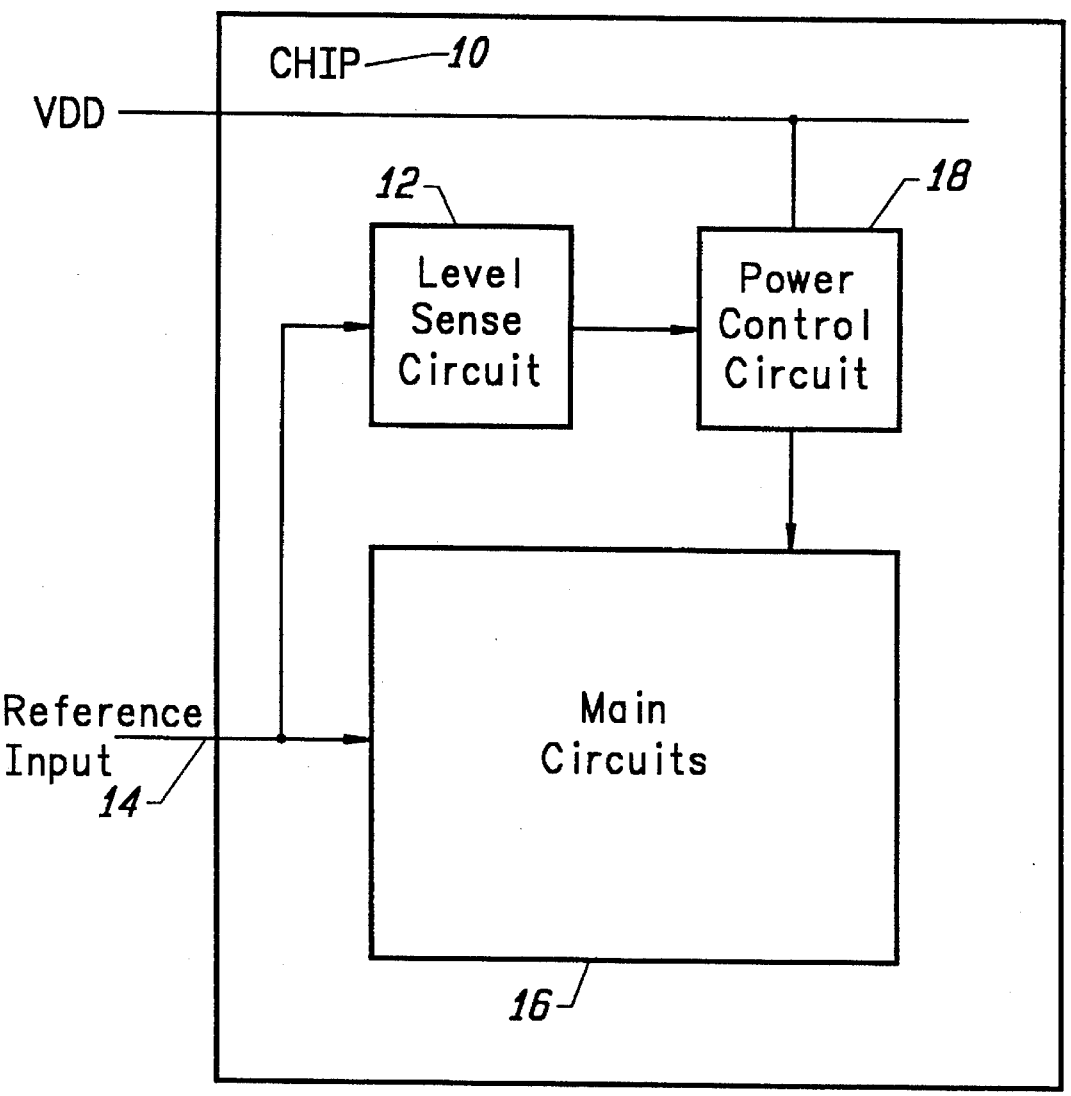
FIGS. 1–3 are schematics of power control circuitry in analog integrated circuits in accordance with several embodiments of the invention.

Referring now to the drawing, FIG. 1 is a schematic of power control circuitry in accordance with one embodiment of the invention. The invention is particularly advantageous as an integrated component of an analog integrated circuit shown generally at 10, such as an ADC or a DAC. Typically, a reference voltage (e.g., +5 volts) 14 is applied as an input to the integrated circuit 10. The reference voltage will be applied to various stages of the analog circuit for use in converting analog and digital voltages, respectively. Internal to the circuit is a power control circuit 18 which connects the internal power supply, $V_{DD}$, to the various stages of the analog circuit. In this embodiment the Power Control circuit receives an input from the Level Sense circuit 12, which monitors the applied reference voltage to determine if it is within specified operation limits. When the reference voltage is within the operation limits, Level Sense circuit 12 will signal the Power Control circuit 18 to apply VDD power to the various stages of the main analog circuits 16. However, when the reference voltage is outside of the operation limits, the Level Sense circuit 12 will signal the Power Control circuit 18 to disconnect VDD power from the various stages of the analog circuits.

During normal on operation, the reference voltage is set to a specified value by external circuitry. To turn off the chip, the external reference is simply turned off or dropped toward zero volt. Internal to the chip, the external on/off status is sensed and the power consuming circuits in the chip turned off (disabled internally) while the chip is in a power down mode. This is particularly advantageous since users typically will turn off the reference supply to save additional power.

Figure 2:
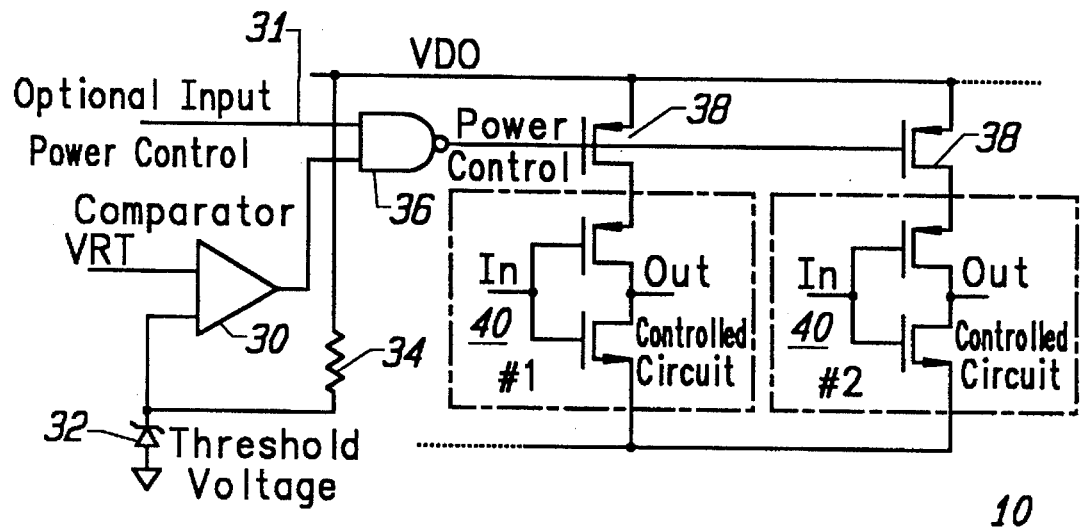

FIG. 2 is a schematic of another embodiment of the invention which can be used with circuits having an input power control pin. In this embodiment, the top reference voltage (VRT) is compared to a known threshold voltage by comparator 30. The threshold voltage can be generated by a zener diode 32 connected to ground or through use of other devices such as forward biased diodes. Resistor 34 connects the diode to the $V_{DD}$ power line for establishing the voltage across the diode. The output of comparator 30 is connected as one input to NAND gate 36, and another input to gate 36 is an input power control signal 31. When the input power control and the comparator output are both high, NAND gate 36 provides a negative output as a conducting bias to the gates of transistors 38 which connect the internal power voltage, $V_{DD}$, to various stages 40 of the analog integrated circuit. When the reference voltage VRT drops below the threshold voltage established by the diode, the power control signal out of the comparator turns off the power bus through control of transistors 38.

Figure 3:
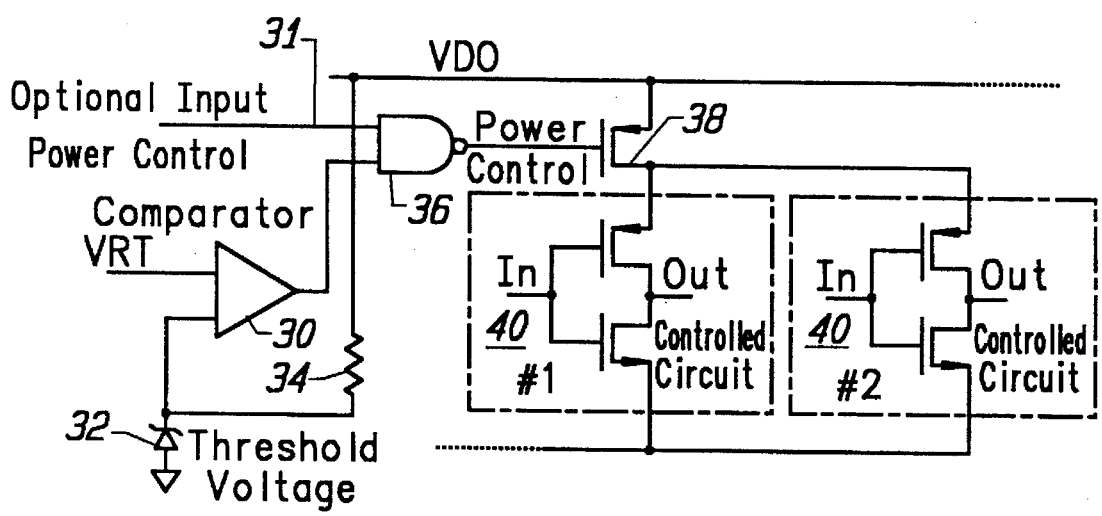

FIG. 3 is a schematic of another embodiment of the invention which is similar to the embodiment of FIG. 2 but in which a single transistor 38 controls power to stages 40 of the integrated circuit. In both embodiments the power control signal at the output of NAND gate 36 can be brought out of the chip via an additional pin for test purposes.

Using the reference voltage input to control the power up/power down capability of a chip allows power control circuitry to be added to existing chip designs that did not previously have this capability due to limitations in the chip pin out. The internal power control of the analog circuit along with the removal of external reference voltages combine to provide additional power savings during off periods. By using the internal chip power control, time delays for returning the chip to the on state are reduced. This is in contrast to power control techniques with one switch for controlling the DC supply voltages to a number of chips to obtain power control. The invention is readily implemented with second source chips based on circuit designs with limited pin out as well as new designs in which an optional input power control is provided.

The invention is particularly useful with analog circuits such as ADCs and DACs. However, while the invention has been described with reference to specific embodiments, the description is illustrative of the invention and not to be construed as limiting the invention. Various modifications and applications may occur to those skilled in the art without parting from the true spirit and scope of the invention as defined by the appended claims.

What is claimed is:

1. A packaged analog integrated circuit having a package pin which receives a reference voltage from an external source for use as a reference in analog/digital voltage conversions, said circuit comprising a plurality of circuit stages each receiving electrical power from a power source, conductor means for applying said reference voltage from said external source to said integrated circuit, and power control circuitry for selectively controlling electrical power to said circuit stages in response to said reference voltage, said power control circuitry including switch means for connecting and disconnecting said power source to said circuit stages, logic means responsive to said reference voltage for controlling said switch means, said logic means including a comparator for comparing said reference voltage to an internal threshold voltage, and, means for generating said threshold voltage from said power source.

2. The analog integrated circuit as defined by claim 1 wherein said means for generating comprises a diode and a resister serially connected between said power source and a second reference voltage.

3. The analog integrated circuit as defined by claim 2 wherein said second reference voltage is ground.

4. The analog integrated circuit as defined by claim 1 wherein said logic means further includes a logic gate responsive t said reference voltage as a first input to said logic gate and including a second input for receiving a power control signal from another external source.

5. The analog integrated circuit as defined by claim 4 wherein said logic gate comprises a NAND gate.

6. The analog integrated circuit as defined by claim 5 wherein said switch means comprises a field effect transistor having a gate terminal, an output of said logic gate providing a bias voltage to said field effect transistor.

7. The analog integrated circuit as defined by claim 6 wherein said switch means comprises a plurality of field effect transistors each connecting said power source to respective ones of said circuit stages.

8. The analog integrated circuit as defined by claim 6 wherein said analog integrated circuit comprises an analog to digital converter.

* * * * *